(12) United States Patent
Ningaraju et al.

(10) Patent No.: US 10,784,369 B2
(45) Date of Patent: Sep. 22, 2020

(54) HIGH-VOLTAGE SEMICONDUCTOR DEVICE

(71) Applicant: Nuvoton Technology Corporation, Hsinchu (TW)

(72) Inventors: Vivek Ningaraju, Mysore (IN); Vinay Suresh, Bangalore (IN); Po-An Chen, Toufen (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 16/378,651

(22) Filed: Apr. 9, 2019

(65) Prior Publication Data

US 2019/0334031 A1    Oct. 31, 2019

(30) Foreign Application Priority Data

Apr. 25, 2018 (TW) .............................. 107114008 A (51) Int. Cl.
| | | |
|---|---|---|
| *H01L 29/78* | (2006.01) | |
| *H01L 29/06* | (2006.01) | |
| *H01L 29/08* | (2006.01) | |
| *H01L 29/66* | (2006.01) | |
| *H01L 21/8234* | (2006.01) | |
| *H01L 21/8238* | (2006.01) | |

(52) U.S. Cl.
CPC .. *H01L 29/7816* (2013.01); *H01L 21/823493* (2013.01); *H01L 21/823892* (2013.01); *H01L 29/0623* (2013.01); *H01L 29/0649* (2013.01); *H01L 29/0865* (2013.01); *H01L 29/0882* (2013.01); *H01L 29/6659* (2013.01); *H01L 29/66681* (2013.01); *H01L 29/7835* (2013.01)

(58) Field of Classification Search
CPC .......... H01L 29/6659; H01L 29/66681; H01L 29/7816; H01L 29/66659; H01L 29/7835; H01L 29/0623; H01L 21/823493; H01L 21/823892
See application file for complete search history.

(56) References Cited

U.S. PATENT DOCUMENTS

| | | | | |
|---|---|---|---|---|
| 6,924,531 B2* | 8/2005 | Chen | ................... | H01L 29/1083 |
| | | | | 257/122 |
| 7,960,222 B1* | 6/2011 | Kwon | ................. | H01L 27/0921 |
| | | | | 438/197 |

(Continued)

*Primary Examiner* — Jose R Diaz
(74) *Attorney, Agent, or Firm* — Muncy, Geissler, Olds & Lowe, P.C.

(57) ABSTRACT

A high-voltage semiconductor device includes a semiconductor substrate having a first conductivity type, a source region and a drain region disposed on the semiconductor substrate. The drain region has a second conductivity type that is the opposite of the first conductivity type, and the source region includes a part having the first conductivity type and another part having the second conductivity type. The device includes a first and a second isolation structures disposed on two opposite sides of the drain region. The first isolation structure is between the source and the drain region. The device includes a first well region disposed below the second isolation structure. The top surface of the first well region is adjacent to the bottom surface of the second isolation structure. In addition, the device includes a first buried layer disposed in the semiconductor substrate and that overlaps the first well region.

10 Claims, 4 Drawing Sheets

(56) References Cited

U.S. PATENT DOCUMENTS

2010/0006937 A1    1/2010   Lee
2013/0093017 A1    4/2013   Ko
2016/0240660 A1    8/2016   Yue et al.

* cited by examiner

HIGH-VOLTAGE SEMICONDUCTOR DEVICE

CROSS REFERENCE TO RELATED APPLICATIONS

This Application claims priority of Taiwan Patent Application No. 107114008, filed on Apr. 25, 2018, the entirety of which is incorporated by reference herein.

BACKGROUND OF THE INVENTION

1. Field of the Invention

The present invention relates to a semiconductor device, more particularly to a high-voltage semiconductor device.

2. Description of the Related Art

High-voltage semiconductor device technology is applicable to high-voltage and high-power integrated circuits. Conventional high-voltage semiconductor devices, such as vertically diffused metal oxide semiconductor (VDMOS) transistors and laterally diffused metal oxide semiconductor (LDMOS) transistors, mainly find application in devices that operate above 12V. These high-voltage devices are cost-effective and easily compatible with other processes, so the high-voltage devices have been widely used in display driver IC devices and power suppliers, and in the fields of power management, communications, automotive electronics, and industrial control.

Existing high-voltage semiconductor devices can gradually meet specific purposes, but they still are not fully compliant in all respects. Therefore, there is still demand for improvement in high-voltage semiconductor devices and manufacturing technologies.

SUMMARY OF THE INVENTION

The present invention provides embodiments of high-voltage semiconductor devices. More particularly, the present invention provides embodiments of laterally diffused metal oxide semiconductor (LDMOS) transistors. In order to manufacture an LDMOS transistor having a specific breakdown voltage, dopant concentrations of well regions of the LDMOS transistor can be adjusted during the manufacturing process, to meet the requirements in different product applications. However, in actual manufacturing process, such as integral manufacturing process of bipolar-CMOS-DMOS, adjustment of the dopant concentrations of well regions need to add an extra mask in the manufacturing process, and the manufacturing cost is also increased.

In order to improve the breakdown voltage of the LDMOS transistor, the LDMOS transistor of the present invention includes a first well region and a first buried layer, which have the opposite conductivity type from that of the drain region, disposed on the side of the drain region opposite a source region. The first well region and the first buried layer are connected to form an L-shaped structure, and the horizontal part of the L-shaped structure extends toward the source region. By disposing the L-shaped structure, the size of the depletion region of the LDMOS transistor can be increased when a reverse voltage is applied to the drain region of the LDMOS transistor, such that the breakdown voltage of the LDMOS transistor can be improved. The LDMOS transistor having a high breakdown voltage can be applied in a level shifter or a high-voltage integrated circuit (HVIC) chip.

According to some embodiments, the present invention provides a high-voltage semiconductor device. The high-voltage semiconductor device comprises a semiconductor substrate having a first conductivity type, and a source region and a drain region disposed on the semiconductor substrate. The drain region has a second conductivity type that is the opposite of the first conductivity type, and the source region has a part having the first conductivity type and another part having the second conductivity type. The high-voltage semiconductor device also comprises a first isolation structure and a second isolation structure disposed on two opposite sides of the drain region, and a first well region disposed below the second isolation structure and having the first conductivity type. A top surface of the first well region is adjacent to a bottom surface of the second isolation structure. The high-voltage semiconductor device further comprises a first buried layer disposed inside the semiconductor substrate and having the first conductivity type. The first buried layer overlaps the first well region.

According to some embodiments, the present invention provides a high-voltage semiconductor device. The high-voltage semiconductor device comprises a semiconductor substrate having a first conductivity type, an epitaxial layer disposed on the semiconductor substrate, a source region and a first drain region disposed in the epitaxial layer. The first drain region has a second conductivity type that is the opposite of the first conductivity type, and the source region comprises a part having the first conductivity type and another part having the second conductivity type. The high-voltage semiconductor device also comprises a first isolation structure and a second isolation structure disposed on the epitaxial layer. The first drain region is located between the first isolation structure and the second isolation structure, and the first isolation structure is between the source region and the first drain region. The high-voltage semiconductor device further comprises a first well region disposed inside the epitaxial layer and under the second isolation structure. The first well region has the first conductivity type and is fully covered by the second isolation structure. In addition, the high-voltage semiconductor device comprises a first buried layer disposed below the first well region, and having the first conductivity type, and the first buried layer contacts the first well region and extends directly below the first drain region.

BRIEF DESCRIPTION OF THE DRAWINGS

The structure, operating principle and effects of the present invention will be described in detail by ways of various embodiments which are illustrated in the accompanying drawings.

DETAILED DESCRIPTION OF THE PREFERRED EMBODIMENTS

The following embodiments of the present invention are herein described in detail with reference to the accompanying drawings. These drawings show specific examples of the embodiments of the present invention. It should be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative features and ratios of elements in the drawings may be exaggerated or diminished in size for the sake of clarity and convenience. Such arbitrary features are only illustrative and not limiting in any way. The same reference numbers are used in the drawings and description to refer to the same or like parts.

It should be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

Figure 1:
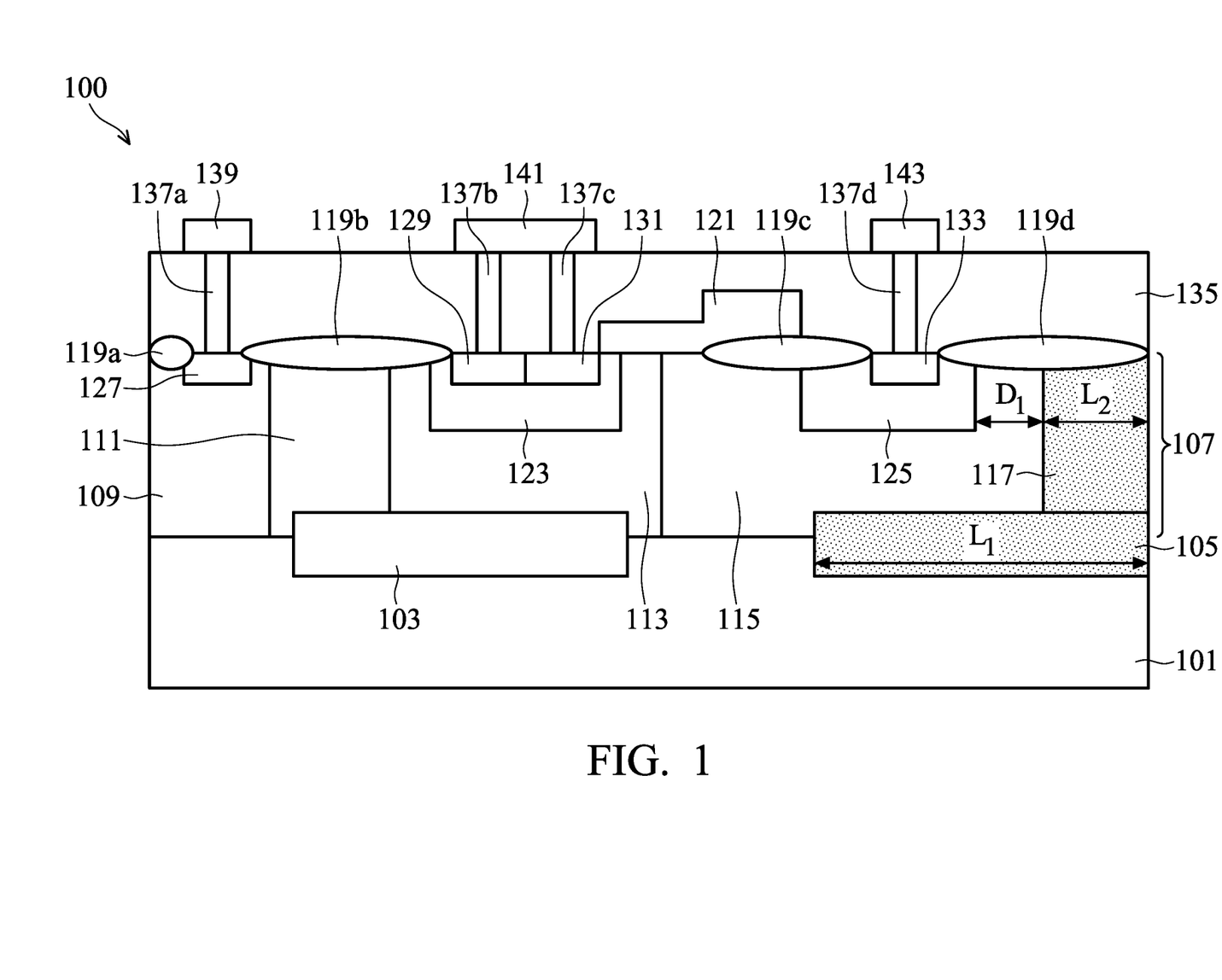
FIG. 1 is a schematic cross-sectional view of a high-voltage semiconductor device according to some embodiments of the present invention.

FIG. 1 is a schematic cross-sectional view of a high-voltage semiconductor device 100 according to some embodiments of the present invention. The high-voltage semiconductor device 100 comprises a semiconductor substrate 101. In some embodiments, the semiconductor substrate 101 is made of silicon or other semiconductor materials, or the semiconductor substrate 101 can include other elementary semiconductor materials, such as germanium (Ge). In some embodiments, the semiconductor substrate 101 is made of compound semiconductors, such as SiC, GaN, GaAs, InAs or InP. In some embodiments, the semiconductor substrate 101 is made of alloy semiconductors, such as silicon germanium, silicon germanium carbide, gallium arsenic phosphide or gallium indium phosphide.

Furthermore, the semiconductor substrate 101 may include a silicon-on-insulator (SOI) substrate. In some embodiments, the semiconductor substrate 101 can be a P-type or N-type lightly-doped substrate. In this embodiment, the semiconductor substrate 101 is P-type and has P-type dopants, such as boron (B). The high-voltage semiconductor device 100 formed on the semiconductor substrate 101 includes an N-type LDMOS transistor.

The high-voltage semiconductor device 100 can comprise an epitaxial layer 107 disposed on the semiconductor substrate 101. In some embodiments, the epitaxial layer 107 can be N-type or P-type. In some embodiments, the epitaxial layer 107 can be formed by metal-organic chemical vapor deposition, plasma-enhanced CVD, molecular beam epitaxy (MBE), hydride vapor phase epitaxy (HVPE), liquid phase epitaxy (LPE), chloride-vapor phase epitaxy (Cl-VPE), or a combination thereof, or another similar manufacturing process. In other embodiments, the high-voltage semiconductor device 100 can be formed without the epitaxial layer 107, and the high-voltage well regions, the well regions and the doped regions, which are originally formed inside the epitaxial layer 107, can be formed inside the semiconductor substrate 101 directly. That is, the high-voltage well region, the well regions and the doped regions are formed close to a top surface of the semiconductor substrate 101.

Furthermore, as shown in FIG. 1, the high-voltage semiconductor device 100 comprises a first buried layer 105 and a second buried layer 103 disposed in the semiconductor substrate 101 and the epitaxial layer 107. The conductivity types of the first buried layer 105 and the second buried layer 103 are opposite to each other. For example, in this embodiment, the first buried layer 105 can be P-type, and the second buried layer 103 can be N-type. Furthermore, the dopant concentration of each of the first buried layer 105 and the second buried layer 103 is in a range from about $1 \times 10^{16}$ atom/cm$^3$ to about $1 \times 10^{19}$ atom/cm$^3$.

The methods for forming the first buried layer 105 and the second buried layer 103 include implanting P-type dopants such as boron (B), or N-type dopants such as phosphorus (P) or arsenic (As), into the semiconductor substrate 101 before the formation of the epitaxial layer 107, and then performing heat treatment to drive the implanted ions into the semiconductor substrate 101. Afterwards, the epitaxial layer 107 is formed on the semiconductor substrate 101. In some embodiments, the epitaxial layer 107 is formed under a high temperature condition, so the implanted ions can be diffused into the epitaxial layer 107. As shown in FIG. 1, the first buried layer 105 and the second buried layer 103 are disposed close to an interface between the semiconductor substrate 101 and the epitaxial layer 107, and each of the first buried layer 105 and the second buried layer 103 comprises a part located in the semiconductor substrate 101 and another part located in the epitaxial layer 107.

The high-voltage semiconductor device 100 comprises a well region 117, a high-voltage well region 115, a high-voltage well region 113, a high-voltage well region 111 and a high-voltage well region 109 which are disposed in the epitaxial layer 107. The well region 117 is also referred to as a first well region, the high-voltage well region 115 is also referred to as a first high-voltage well region, the high-voltage well region 113 is also referred to as a second high-voltage well region, and the high-voltage well region 111 and the high-voltage well region 109 are also referred to as third high-voltage well regions. The high-voltage well region 109, the high-voltage well region 113 and the well region 117 have the same conductivity type as the first buried layer 105, and the high-voltage well region 111 and the high-voltage well region 115 have the same conductivity type as the second buried layer 103. In this embodiment, the high-voltage well region 109 and 113, and the well region 117 are P-type, and the high-voltage well region 111 and 115 are N-type.

Furthermore, the process of forming the high-voltage well regions 109, 111, 113 and 115 and the well region 117 includes the ion implantation process and thermal drive-in process. In some embodiments, the dopant concentration of the well region 117 is higher than or equal to that of the high-voltage well regions 109, 111, 113 and 115. For example, the dopant concentrations of each of the high-voltage well regions 109, 111, 113 and 115 is in a range from about $1\times10^{15}$ atom/cm³ to about $5\times10^{17}$ atom/cm³, and the dopant concentration of the well region 117 is in a range from about $5\times10^{15}$ atom/cm³ to $1\times10^{18}$ atom/cm³.

After the high-voltage well regions 109, 111, 113 and 115 and the well region 117 are formed, the well region 125 is formed in the high-voltage well region 115, and the well region 125 is also referred to as a second well region or a drift region. The well region 123 is formed in the high-voltage well region 113, and the well region 123 is also referred to as a third well region or a body region. The conductivity types of the well regions 123 and 125 are opposite to each other. Specifically, the well region 123 has the same conductivity type as the high-voltage well region 113, and the well region 125 has the same conductivity type as the high-voltage well region 115. In this embodiment, the well region 123 is P-type, and the well region 125 is N-type. The manufacturing process used to form the well regions 123 and 125 is the same or similar to the manufacturing process of forming the well region 117, so the description is not repeated herein. In some embodiments, the dopant concentration of each of the well regions 123 and 125 is higher than the dopant concentration of the well region 117, and is in a range from about $5\times10^{16}$ atom/cm³ to about $5\times10^{18}$ atom/cm³.

According to some embodiments, as shown in FIG. 1, the high-voltage semiconductor device 100 comprises an isolation structure 119a, an isolation structure 119b, an isolation structure 119c, and an isolation structure 119d disposed on the epitaxial layer 107. The isolation structure 119b is also referred to as a third isolation structure, the isolation structure 119c is also referred to as a first isolation structure, and the isolation structure 119d is also referred to as a second isolation structure. More specifically, a part of each of the isolation structures 119a, 119b, 119c and 119d is embedded in the epitaxial layer 107. In some embodiments, the isolation structures 119a, 119b, 119c, and 119d can be made of silicon oxide, and can be local-oxidation-of-silicon (LOCOS) isolation structures formed by thermal oxidation. In other embodiments, the isolation structures 119a, 119b, 119c and 119d can be shallow trench isolation structures formed by etching process and deposition process.

In some embodiments, after the isolation structures 119a, 119b, 119c, and 119d are formed, the gate structure 121 is then formed on the epitaxial layer 107. As shown in FIG. 1, the gate structure 121 extends from the well region 123 to the isolation structure 119c, and the gate structure 121 covers a part of the well region 123, a part of the high-voltage well region 113 and a part of the high-voltage well region 115.

The gate structure 121 comprises a gate dielectric layer, and a gate electrode disposed on the gate dielectric layer. The gate dielectric layer and the gate electrode are not shown in figures. The dielectric material layer and the conductive material layer can be blanketly deposited on the epitaxial layer 107 in a sequential order, and the dielectric material layer and the conductive material layer are respectively patterned using the photolithography process and the etching process, so as to form the gate structure 121 including the gate dielectric layer and the gate electrode.

The material of the dielectric material layer, which is the material of the gate dielectric layer, can include silicon oxide, silicon nitride, silicon oxynitride, high-k dielectric material, or a combination thereof, or other appropriate dielectric material. In some embodiments, the dielectric material layer can be formed using CVD or spin coating method. The material of the conductive material layer, which is the material of the gate electrode, can be amorphous silicon (a-Si), polysilicon, one or more metals, metal nitride, conductive metal oxide, or a combination thereof, or other appropriate conductive material. The material of the conductive material layer can be formed using CVD, sputtering method, resistive thermal evaporation method, electron beam evaporation method, or other appropriate deposition method. Furthermore, the gate structure 121 comprises insulation spacers disposed on opposite sidewalls of the gate structure 121. The insulation spacers are not shown in figures.

As shown in FIG. 1, the high-voltage semiconductor device 100 includes a doped region 127, a doped region 129, a doped region 131 and a doped region 133. The doped region 127 is located between the isolation structure 119a and the isolation structure 119b. The doped region 129 is disposed adjacent to the doped region 131, and the doped regions 129 and 131 are located between the isolation structure 119b and the gate structure 121. The doped region 133 is located between the isolation structure 119c and the isolation structure 119d. In some embodiments, the doped regions 127, 129, 131, and 133 are formed after the gate structure 121 is formed.

In this embodiment, the doped regions 127 and 129 are P-type, and the doped regions 131 and 133 are N-type. The dopant concentration of each of the doped regions 127, 129, 131, and 133 is higher than the dopant concentration of each of the well regions 117, 123 and 125. In some embodiments, the dopant concentration of each of the doped regions 127, 129, 131 and 133 is in a range from about $1\times10^{19}$ atom/cm³ to about $5\times10^{20}$ atom/cm³. It should be noted that the doped regions 129 and 131 can be served as the source regions of the high-voltage semiconductor device 100, and the doped region 133 can be served as the drain region of the high-voltage semiconductor device 100.

The high-voltage semiconductor device 100 comprises a dielectric layer 135 disposed on the epitaxial layer 107. The dielectric layer 135 can have a multi-layer structure formed by a plurality of dielectric materials, such as silicon oxide, silicon nitride, silicon oxynitride, phosphosilicate glass (PSG), borophosphosilicate glass (BPSG), low-k dielectric material or other appropriate dielectric material.

Furthermore, as shown in FIG. 1, the high-voltage semiconductor device 100 comprises contacts 137a, 137b, 137c, and 137d formed on the epitaxial layer 107 and inside the dielectric layer 135. Furthermore, the high-voltage semiconductor device 100 can comprise a substrate electrode 139 disposed on the contact 137a, a source electrode 141 disposed on the contacts 137b and 137c, and a drain electrode 143 disposed on the contact 137d. In some embodiments, the material of each of the contacts 137a, 137b, 137c, 137d, the substrate electrode 139, the source electrode 141, and the drain electrode 143 can be aluminum (Al), copper (Cu), tungsten (W), titanium (Ti), tantalum (Ta), titanium nitride (TiN), tantalum nitride (TaN), nickel silicide (NiSi), cobalt silicide (CoSi), tantalum carbide (TaC), tantalum silicon nitride (TaSiN), tantalum carbonitride (TaCN), titanium aluminide (TiAl), titanium aluminum nitride (TiAlN), or a combination thereof, or other appropriate conductive material.

The substrate electrode 139 is electrically connected to the doped region 127 through the contact 137a, the source electrode 141 is electrically connected to the doped regions 129 and 131 through the contacts 137b and 137c, and the drain electrode 143 is electrically connected to the doped region 133 through the contact 137d. The doped regions 129 and 131 are also referred to as the source region, and the doped region 133 is also referred to as the drain region.

According to some embodiments, as shown in FIG. 1, after the substrate electrode 139, the source electrode 141 and the drain electrode 143 are formed, the high-voltage semiconductor device 100 is completed. In some embodiments, the length L1 of the first buried layer 105 is in a range from about 4 μm to about 30 μm, the length L2 of the first well region 117 is in a range from about 3 μm to about 15 μm, and the distance D1 between the first well region 117 and the well region 125 is in a range from about 2 μm to about 20 μm.

In some embodiments, the top surface of the first well region 117 is adjacent to the bottom surface of the isolation structure 119d. In some embodiments, the first well region 117 is completely covered by the isolation structure 119d; in the other words, the projection area of the first well region 117 on the top surface of the semiconductor substrate 101 is within the projection area of the isolation structure 119d on the top surface of the semiconductor substrate 101. Furthermore, the first buried layer 105 overlaps the first well region 117. In some embodiments, as shown in FIG. 1, the first buried layer 105 contacts the first well region 117, and extends directly below the drain region 133, the well region 125 and the isolation structure 119c. In other embodiments, the first buried layer 105 may not extend directly below the isolation structure 119c, or the first buried layer 105 may not extend directly below the drain region 133.

According to some embodiments of the present invention, in order to improve the breakdown voltage of the high-voltage semiconductor device 100, the first well region 117 and first buried layer 105 having the opposite conductivity type from the drain region 133 can be disposed on the side of the drain region 133 opposite to the source regions 129 and 131, respectively. The first well region 117 and the first buried layer 105 are connected to form an L-shaped structure, and a horizontal part of the L-shaped structure extends toward the source regions 129 and 131. By disposing the L-shaped structure, the size of the depletion region of the high-voltage semiconductor device 100 can be increased when a reverse voltage is applied to the drain electrode of the LDMOS transistor, such that the breakdown voltage of the device can be improved. The LDMOS transistor having the high breakdown voltage can be widely applied in a level shifter or a HVIC chip.

Figure 2:
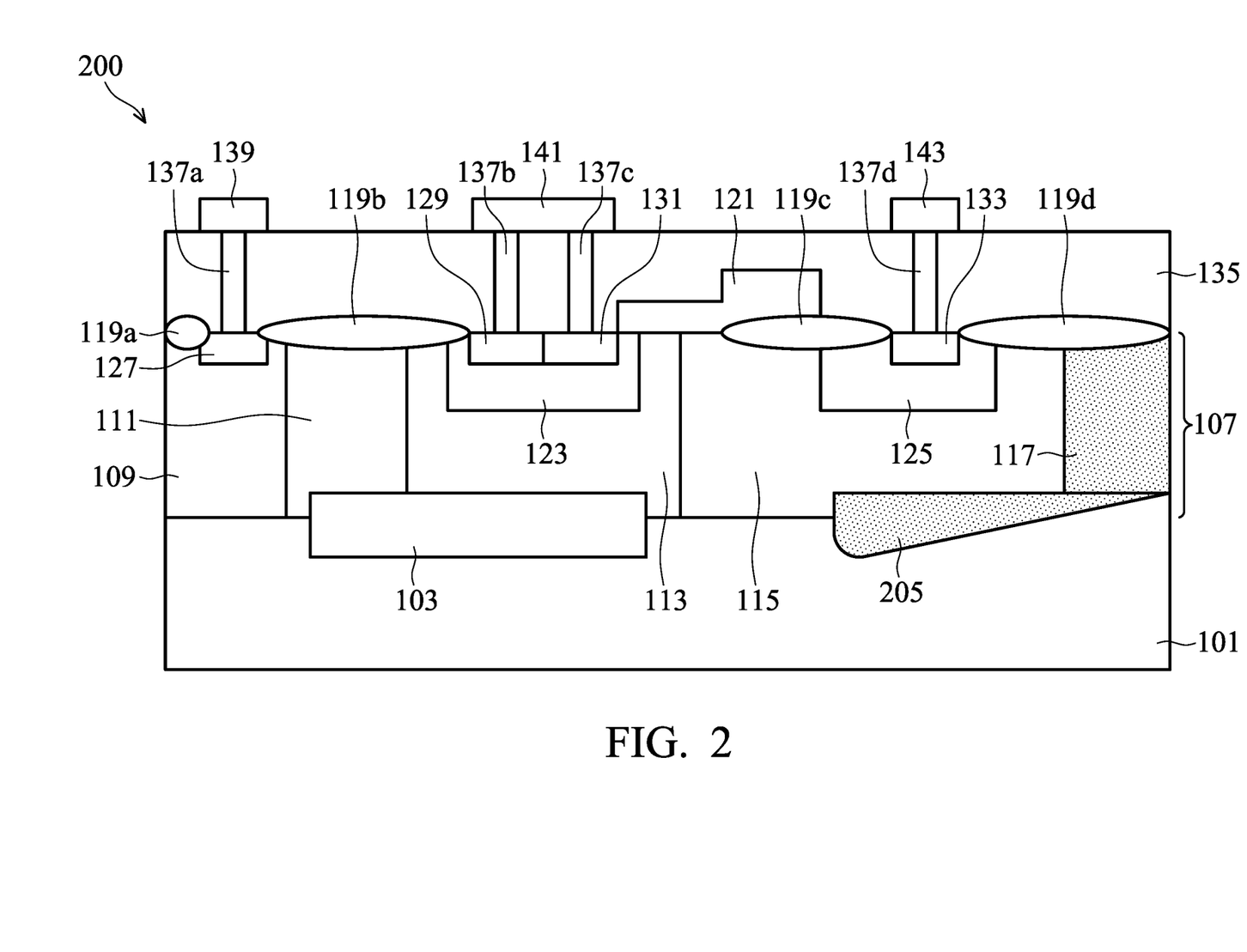
FIG. 2 is a schematic cross-sectional view of a high-voltage semiconductor device according to some embodiments of the present invention.

FIG. 2 is a schematic cross-sectional view of a high-voltage semiconductor device 200 according to some embodiments of the present invention. The difference between the high-voltage semiconductor device 200 and the high-voltage semiconductor device 100 is the shape of the first buried layer 205. The manufacturing process for other components of the high-voltage semiconductor device 200 and the materials of the other components of the high-voltage semiconductor device 200 are the same as or similar to that of the high-voltage semiconductor device 100, so the descriptions are not repeated herein. As shown in FIG. 2, the thickness of the first buried layer 205 of the high-voltage semiconductor device 200 can be increased along the direction from the isolation structure 119d to the isolation structure 119c.

Figure 3:
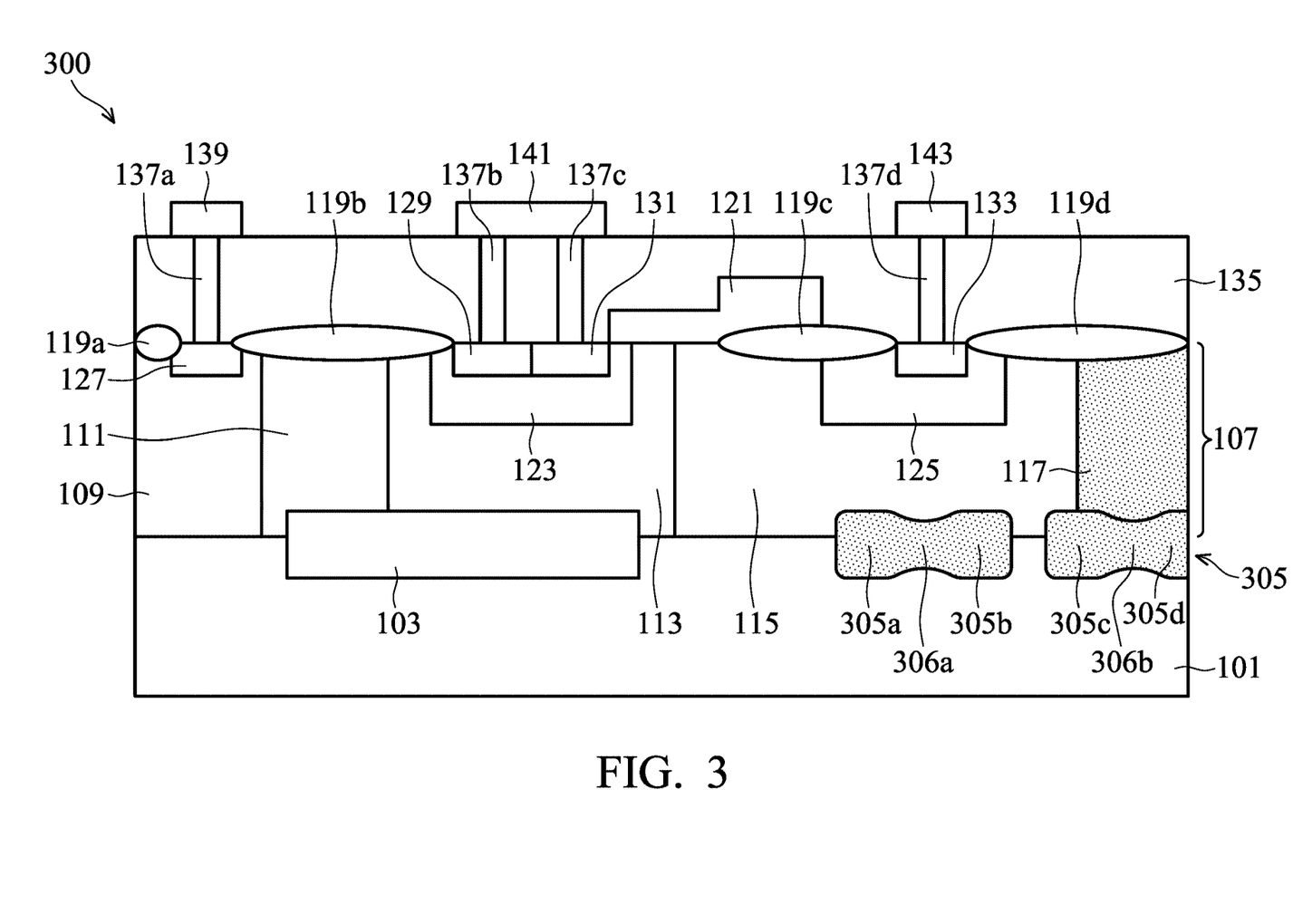
FIG. 3 is a schematic cross-sectional view of a high-voltage semiconductor device according to some embodiments of the present invention.

FIG. 3 is a schematic cross-sectional view of a high-voltage semiconductor device 300 according to some embodiments of the present invention. The difference between the high-voltage semiconductor device 300 and the high-voltage semiconductor device 100 is the shape of the first buried layer 305. The manufacturing process for other components of the high-voltage semiconductor device 300 and the materials of the other components of the high-voltage semiconductor device 300 are the same as or similar to that of the high-voltage semiconductor device 100, so the descriptions are not repeated herein.

As shown in FIG. 3, the first buried layer 305 of the high-voltage semiconductor device 300 comprises a plurality of sections such as sections 305a, 305b, 305c, and 305d, and the sections 305a and 305b are connected through a connection part 306a, and the sections 305c and 305d are connected through a connection part 306b. In some embodiments, the way of forming the first buried layer 305 includes performing ion etching process by using a patterned photoresist to form a plurality of discrete doped sections (not shown in figures) in the semiconductor substrate 101, and then performing heat treatment process to outwardly diffuse the ions of the doped sections for interconnection.

As shown in FIG. 3, the section 305a is electrically connected to the section 305b through the connection part 306a, the section 305c is electrically connected to the section 305d through the connection part 306b. In other embodiments, the sections 305a, 305b, 305c, and 305d can be completely connected through the connection parts and not separated from each other. It should be noted that by forming the first buried layer 305 through a plurality of noncontinuous-doped sections, the dopant concentration of each of the doped sections can be adjusted, so that the characteristics of the high-voltage semiconductor device 300 can be effectively controlled during the manufacturing process. As a result, the device can be adjusted to have different breakdown voltages by different depletion levels of the first buried layer 305.

Figure 4:
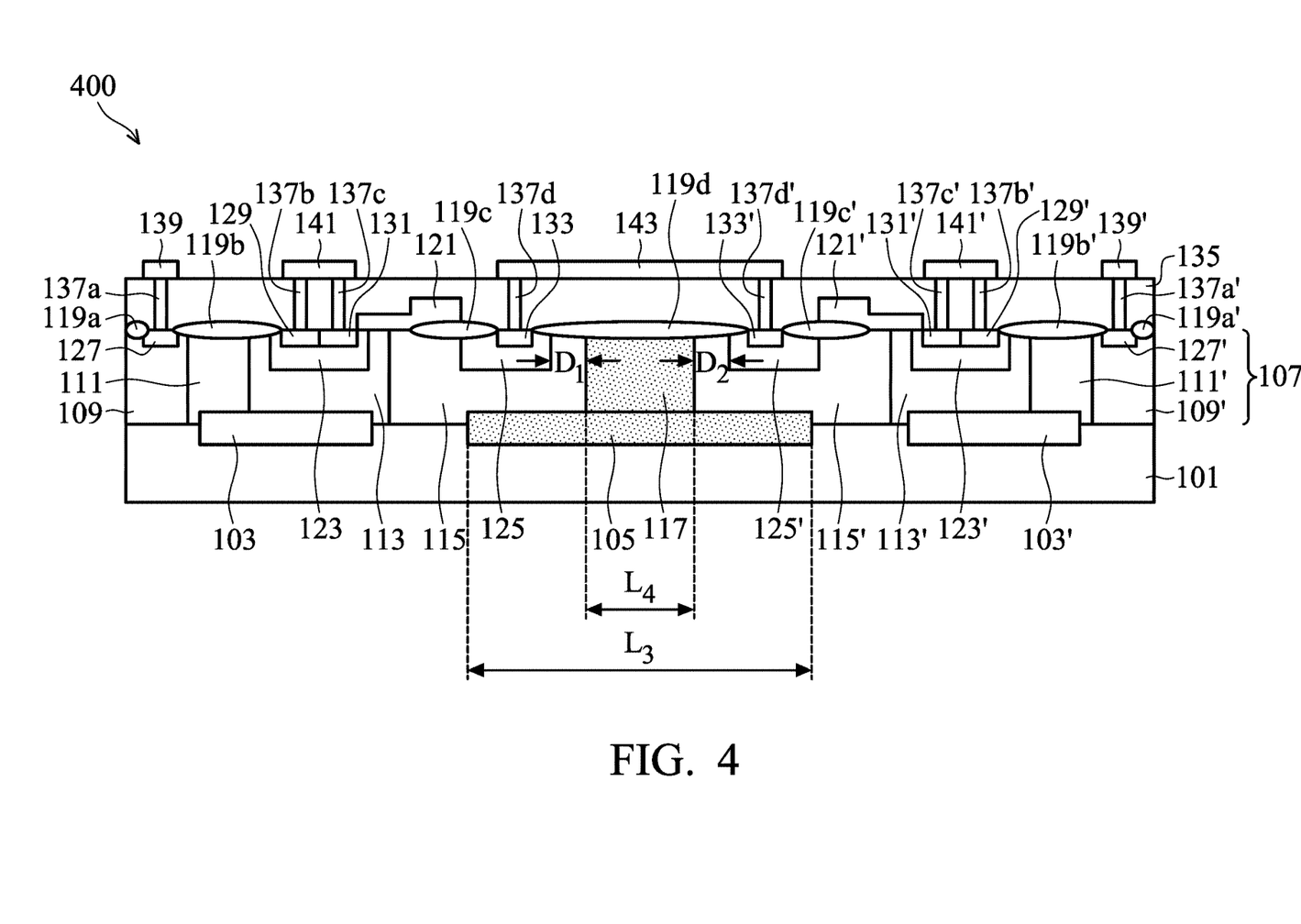
FIG. 4 is a schematic cross-sectional view of a high-voltage semiconductor device according to some embodiments of the present invention.

FIG. 4 is a schematic cross-sectional view of a high-voltage semiconductor device 400 according to some embodiments of the present invention. In the cross-sectional view shown in FIG. 4, the high-voltage semiconductor device 400 is in symmetry with respect to centerlines of the first buried layer 105 and the first well region 117. In the other words, the left half of the high-voltage semiconductor device 400 is the high-voltage semiconductor device 100, and the right half of the high-voltage semiconductor device 400 is a mirror of the high-voltage semiconductor device 100.

It should be noted that the high-voltage semiconductor device 400 is a structure with the drain electrode 143 in the center, and the high-voltage semiconductor device 400 includes, a substrate electrode 139, a source electrode 141, a drain electrode 143, a source electrode 141' and a substrate electrode 139' disposed from left to right in a sequential order. Drain regions 133 and 133' located at opposite sides of isolation structure 119d are electrically connected to the drain electrode 143 through contacts 137d and 137d', respectively.

Like the left side structure of the high-voltage semiconductor device 400, the right side structure of the high-voltage semiconductor device 400 includes the contacts 137c', 137b' and 137a', isolation structures 119c', 119b' and 119a', a gate structure 121', doped regions 131' and 129', a doped region 127', well regions 125' and 123', high-voltage well regions 115', 113', 111' and 109', and a first buried layer 103'. The doped regions 131' and 129' are also referred to as the source region. The manufacturing process of the components of the high-voltage semiconductor device 400 and the material of the components of the high-voltage semiconductor device 400 are the same as or similar to those of the high-voltage semiconductor device 100, so the descriptions are not repeated herein.

According to some embodiments, as shown in FIG. 4, a length L3 of the first buried layer 105 is in a range from about 10 μm to about 60 μm, and a length L4 of the first well region 117 is in a range from about 6 μm to about 30 μm. Furthermore, similar to the high-voltage semiconductor device 100 of FIG. 1, the distance D1 between the first well region 117 and the well region 125 of the high-voltage semiconductor device 400 is in a range from about 2 μm to about 20 μm, and the distance D2 between the first well region 117 and the well region 125' at other side is in a range from about 2 μm to about 20 μm.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A high-voltage semiconductor device, comprising:
   a semiconductor substrate having a first conductivity type;
   a source region and a drain region disposed on the semiconductor substrate, wherein the drain region has a second conductivity type that is opposite of the first conductivity type, and the source region comprises a part having the first conductivity type and another part having the second conductivity type;
   a first isolation structure and a second isolation structure disposed on two opposite sides of the drain region, wherein the first isolation structure is between the source region and the drain region;
   a first well region disposed below the second isolation structure, and having the first conductivity type, wherein a top surface of the first well region is adjacent to a bottom surface of the second isolation structure;
   a first buried layer disposed inside the semiconductor substrate, and having the first conductivity type, wherein the first buried layer overlaps the first well region;
   a first high-voltage well region disposed on the first buried layer, and having the second conductivity type, wherein the first high-voltage well region is disposed adjacent to the first well region and the first buried layer;
   a second well region disposed inside the first high-voltage well region, and having the second conductivity type, wherein the second well region is located between the first isolation structure and the second isolation structure, and the drain region is disposed inside the second well region;
   a second high-voltage well region disposed adjacent to the first high-voltage well region, and having the first conductivity type, wherein the second buried layer is deposited under the second high-voltage well region;
   a third well region disposed inside the second high-voltage well region, and having the first conductivity type, wherein the source region is disposed inside the third well region; and
   a gate structure disposed on the semiconductor substrate and that extends from the third well region to the first isolation structure.

2. The high-voltage semiconductor device as claimed in claim 1, further comprising:
   a second buried layer disposed inside the semiconductor substrate, and having the second conductivity type, wherein the second buried layer is disposed below the source region and separated from the first buried layer.

3. The high-voltage semiconductor device as claimed in claim 1, wherein a length of the first buried layer is greater than a length of the first well region and a length of the second isolation structure.

4. The high-voltage semiconductor device as claimed in claim 1, further comprising:
   a third isolation structure disposed on the semiconductor substrate, wherein the source region is located between the first isolation structure and the third isolation structure; and
   a third high-voltage well region and a doped region disposed on the semiconductor substrate, and having the first conductivity type, wherein the doped region is disposed inside the third high-voltage well region, the third isolation structure is located between the doped region and source region, and the doped region is electrically connected to the semiconductor substrate.

5. A high-voltage semiconductor device, comprising:
   a semiconductor substrate having a first conductivity type;
   an epitaxial layer disposed on the semiconductor substrate;
   a source region and a first drain region disposed inside the epitaxial layer, wherein the first drain region has a second conductivity type that is the opposite of the first conductivity type, and the source region comprises a part having the first conductivity type and another part having the second conductivity type;
   a first isolation structure and a second isolation structure disposed on the epitaxial layer, wherein the first drain region is located between the first isolation structure and the second isolation structure, and the first isolation structure is between the source region and the first drain region;
   a first well region disposed inside the epitaxial layer and under the second isolation structure, wherein the first well region has the first conductivity type and is fully covered by the second isolation structure; and
   a first buried layer disposed below the first well region and having the first conductivity type, wherein the first buried layer contacts the first well region and extends directly below the first drain region.

6. The high-voltage semiconductor device as claimed in claim 5, further comprising:
   a second buried layer disposed inside the semiconductor substrate, and having the second conductivity type, wherein the second buried layer is disposed below the source region and separated from the first buried layer.

7. The high-voltage semiconductor device as claimed in claim 5, further comprising:
   a first high-voltage well region, a second high-voltage well region and a third high-voltage well region disposed in the epitaxial layer, wherein the second high-voltage well region is located between the first high-voltage well region and the third high-voltage well region, the first drain region is disposed in the first high-voltage well region, the source region is disposed in the second high-voltage well region, the first high-voltage well region has the second conductivity type, and the second high-voltage well region and the third high-voltage well region have the first conductivity type; and
   a doped region disposed in the third high-voltage well region, and having the first conductivity type, wherein the doped region is electrically connected to the semiconductor substrate.

8. The high-voltage semiconductor device as claimed in claim 5, wherein a thickness of the first buried layer increases along a direction from the second isolation structure to the first isolation structure.

9. The high-voltage semiconductor device as claimed in claim 5, wherein the first buried layer comprises a plurality of sections connected through a connection part, and a thickness of the connection part is less than a thickness of the plurality of sections.

10. The high-voltage semiconductor device as claimed in claim 5, further comprising:
   a second drain region disposed in the epitaxial layer and having the second conductivity type, wherein the first well region and the second isolation structure are located between the first drain region and the second drain region, and the first buried layer extends directly below the second drain region.

* * * * *